United States Patent
Rykaczewski et al.

(10) Patent No.: US 10,937,716 B2
(45) Date of Patent: Mar. 2, 2021

(54) MULTI-LAYER THIN FILM COMPOSITE THERMAL INTERFACE MATERIALS

(71) Applicants: Konrad Rykaczewski, Tempe, AZ (US); Robert Wang, Scottsdale, AZ (US)

(72) Inventors: Konrad Rykaczewski, Tempe, AZ (US); Robert Wang, Scottsdale, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 268 days.

(21) Appl. No.: 16/217,906

(22) Filed: Dec. 12, 2018

(65) Prior Publication Data
US 2019/0181069 A1    Jun. 13, 2019

Related U.S. Application Data

(60) Provisional application No. 62/597,873, filed on Dec. 12, 2017.

(51) Int. Cl.
*H01L 23/373* (2006.01)
*B32B 27/14* (2006.01)
(Continued)

(52) U.S. Cl.
CPC ............ *H01L 23/3735* (2013.01); *B32B 5/16* (2013.01); *B32B 27/14* (2013.01); *B32B 27/18* (2013.01);
(Continued)

(58) Field of Classification Search
CPC .. H01L 23/3735; H01L 23/427; H01L 23/433
See application file for complete search history.

(56) References Cited

U.S. PATENT DOCUMENTS

| | | | |
|---|---|---|---|
| 2009/0212418 A1* | 8/2009 | Gurrum | H01L 24/29 257/717 |
| 2012/0187332 A1* | 7/2012 | Iruvanti | B82Y 30/00 252/73 |

(Continued)

FOREIGN PATENT DOCUMENTS

| WO | 2015143389 A1 | 9/2015 |
|---|---|---|
| WO | 2015175989 A2 | 11/2015 |

OTHER PUBLICATIONS

ASTM. "Standard Test Method for Thermal Transmission Properties of Thermally Conductive Electrically Insulating Materials". ASTM Int., D5470, pp. 1-6, 2006.

(Continued)

*Primary Examiner* — Errol V Fernandes
(74) *Attorney, Agent, or Firm* — Fish & Richardson P.C.

(57) ABSTRACT

A layered composite configured to form an interface between a heat exchanger and an integrated circuit includes a first polymer layer, a second polymer layer, a liquid metal in direct contact with the first polymer layer, a solid solute in direct contact with the second polymer layer, and a barrier between the liquid metal and the solid solute. The liquid metal is liquid at normal temperature and pressure. The solid solute includes microparticles, nanoparticles, or both and is solid at normal temperature and pressure. The barrier prevents contact of the liquid metal and the solid solute at normal temperature and pressure, and is configured to rupture under compression of the layered composite, thereby allowing the liquid metal and the solid solute to form a mixture between the first polymer layer and the second polymer layer.

20 Claims, 4 Drawing Sheets

(51) Int. Cl.
- B32B 27/28 (2006.01)
- B32B 27/18 (2006.01)
- H01L 23/00 (2006.01)
- B32B 5/16 (2006.01)
- H01L 23/433 (2006.01)

(52) U.S. Cl.
CPC ........ *B32B 27/283* (2013.01); *H01L 23/3737* (2013.01); *H01L 23/433* (2013.01); *H01L 24/29* (2013.01); *H01L 24/32* (2013.01); *H01L 24/83* (2013.01); *B32B 2255/20* (2013.01); *B32B 2264/105* (2013.01); *B32B 2264/108* (2013.01); *B32B 2307/302* (2013.01); *B32B 2457/08* (2013.01); *H01L 2224/2919* (2013.01); *H01L 2224/29083* (2013.01); *H01L 2224/29193* (2013.01); *H01L 2224/29194* (2013.01); *H01L 2224/32245* (2013.01); *H01L 2224/83101* (2013.01); *H01L 2224/83201* (2013.01); *H01L 2924/0715* (2013.01)

(56) References Cited

U.S. PATENT DOCUMENTS

| | | | |
|---|---|---|---|
| 2014/0248430 A1* | 9/2014 | Wong | H01L 23/373 427/289 |
| 2015/0334871 A1* | 11/2015 | Hill | B32B 9/045 165/185 |
| 2016/0243546 A1 | 8/2016 | Thuo et al. | |
| 2017/0058141 A1 | 3/2017 | Rykaczewski et al. | |
| 2017/0089774 A1 | 3/2017 | Rykaczewski et al. | |
| 2017/0183101 A1 | 6/2017 | Rykaczewski et al. | |
| 2017/0301605 A1* | 10/2017 | Kountanya | H01L 23/3735 |
| 2018/0215927 A1 | 8/2018 | Rykaczewski | |

OTHER PUBLICATIONS

Balachander et al. "Nanowire-Filled Polymer Composites with Ultrahigh Thermal Conductivity". Appl. Phys. Lett. 2013, 102 (9).
Bartlett et al. "High Thermal Conductivity in Soft Elastomers with Elongated Liquid Metal Inclusions". Proc. Natl. Acad. Sci. 2017, 114 (9), pp. 2143-2148.
çinar et al. "Mechanical Fracturing of Core-Shell Undercooled Metal Particles for Heat-Free Soldering". Sci. Rep. 2016, 6, 21864.
Diani et al. "A Review on the Mullins Effect". Eur. Polym. J. 2009, 45 (3), pp. 601-612.
Fassler et al. "Liquid-Phase Metal Inclusions for a Conductive Polymer Composite". Adv. Mater. 2015, 27 (11), pp. 1928-1932.
Fu et al. "Thermal Conductivity Enhancement with Different Fillers for Epoxy Resin Adhesives". Appl. Therm. Eng. 2014, 66 (1-2), pp. 493-498.
Gao et al. "Gallium-Based Thermal Interface Material with High Compliance and Wettability". Appl. Phys. A 2012, 107 (3), pp. 701-708.
Gao et al. "Investigation on the Optimized Binary and Ternary Gallium Alloy as Thermal Interface Materials". J. Electron. Packag. 2016, 139 (Mar.), pp. 1-8.
Ghoshal et al. "High-Performance Liquid Metal Cooling Loops nanoCoolers Technology Focus". 2005, pp. 20-23.
Han et al. "Thermal Conductivity of Carbon Nanotubes and Their Polymer Nanocomposites: A Review". Prog. Polym. Sci. 2011, 36 (7), pp. 914-944.
Huang et al. "A Review of Dielectric Polymer Composites with High Thermal Conductivity". IEEE Electr. Insul. Mag. 2011, 27 (4), pp. 8-16.
Hussain et al. "Review Article: Polymer-Matrix Nanocomposites, Processing, Manufacturing, and Application: An Overview". J. Compos. Mater. 2006, 40 (17), pp. 1511-1575.

Jeong et al. "Mechanically Stretchable and Electrically Insulating Thermal Elastomer Composite by Liquid Alloy Droplet Embedment". Sci. Rep. 2015, 5, 18257, pp. 1-10 Dec. 2015.
Kulikova et al. "Thermal Properties of CuGa2 Phase in Intert Atmosphere". Defect Diffis. Forum 2012, 326-328 (Apr.), pp. 227-232.
Li et al. "Highly Conductive Thermal Paste of Liquid Matal Alloy Dispersed with Copper Particles". In Proceedings of the asme 2016 heat transfer summer conference; Washington DC, 2016, pp. 1-8.
Li et al. "Thermodynamic Assessment of the Copper-Gallium System". Calphad Comput. Coupling Phase Diagrams Thermochem. 2008, 32 (2), pp. 447-453.
Marconnet et al. "Thermal Conduction in Aligned Carbon Nanotube-Polymer Nanocomposites with High Packing Density". ACS Nano 2011, 5 (6), pp. 4818-4825.
McNamara et al. "Characterization of Nanostructured Thermal Interface Materials—a Review". Int. J. Therm. Sci. 2012, 62, pp. 2-11.
Ndieguene et al. "Eternal Packages: Liquid Metal Flip Chip Devices". In Electronic Components and Technology Conference (ECTC), 2016 IEEE 66th; IEEE, 2016; pp. 580-587.
Ohsone et al. "Optical Measurement of Thermal Contact Conductance between Wafer-like Thin Solid Samples". J. Heat Transfer 1999, 121 (Nov.), pp. 954-963.
Pietrak et al. A Review of Models for Effective Thermal Conductivity of Composite Materials. Open Access J.J. Power Technol. 2015, 95 (1), pp. 14-24.
Plevachuk et al. "Thermophysical Properties of the Liquid Ga—In—Sn Eutectic Alloy". J. Chem. Eng. Data 2014, 59, pp. 757-763.
Prasher "Thermal Interface Materials: Historical Perspective, Status, and Future Directions". In Proceedings of the IEEE; IEEE, 2006; vol. 94, pp. 1571-1586.
Prasher et al. "Thermal Interface Materials". In Materials for Advanced Packaging; 2017; pp. 511-535.
Rai et al. "Enhanced Thermal Conduction and Influence of Interfacial Resistance within Flexible High Aspect Ratio Copper Nanowire/polymer Composites". Compos. Sci. Technol. 2017, 144, pp. 70-78.
Ralphs "Investigating the Effect of Carbon Nanotube Functionalization in Polydimethylsiloxane Composite through Use of a Stepped Bar Apparatus" 2016, pp. 15-58.
Ralphs et al. "Technique for Direct Measurement of Thermal Conductivity of Elastomers and a Detailed Uncertainty Analysis". Meas. Sci. Technol. 2016, 27 (11), 115014, pp. 1-9.
Roy et al. "Accelerated Aging and Thermal Cycling of Low Melting Temperature Alloys as Wet Thermal Interface Materials". Microelectron. Reliab. 2015, 55 (12), pp. 2698-2704.
Roy et al. "Thermal Performance of Low Melting Temperature Alloys at the Interface between Dissimilar Materials". Appl. Therm. Eng. 2016, 99, pp. 72-79.
Saba et al. "A Review on Potentiality of Nano Filler/natural Fiber Filled Polymer Hybrid Composites". Polymers (Basel). 2014, 6 (8), pp. 2247-2273.
Sarvar et al. "Thermal Interface Materials—A Review of the State of the Art". 2006 1st Electron. Syst. Technol. Conf. 2006, 2, pp. 1292-1302.
Seshadri et al. "Multifold Increases in Thermal Conductivity of Polymer Nanocomposites through Microwave Welding of Metal Nanowire Fillers". Adv. Mater. Interfaces 2015, 2 (15), 1500186, pp. 1-6.
Suh et al. "Ultrahigh Thermal Conductivity of Interface Materials by Silver-Functionalized Carbon Nanotube Phonon Conduits". Adv. Mater. 2016, pp. 7220-7227.
Tang et al. "Transitional-State Metallic Mixtures ( TransM 2 Ixes ) with Enhanced and Tunable Electrical , Thermal , and Mechanical Properties". ACS Appl. Mater. Interfaces 2017. pp. 35977-35987.
Taphouse et al. "Carbon Nanotube Thermal Interfaces Enhanced with Sprayed on Nanoscale Polymer Coatings". Nanotechnology 2013, 24 (10), 105401, pp. 1-8.
Tavangar et al. "Assessing Predictive Schemes for Thermal Conducitivity Against Diamond-Reinforced Silver Matrix Composites at Intermediate Phase Contrast". Scr. Mater. 2007, 56 (5), pp. 357-360.

(56) References Cited

OTHER PUBLICATIONS

Tekce et al. "Effect of Particle Shape on Thermal Conductivity of Copper Reinforced Polymer Composites". J. Reinf. Plast. Compos. 2007, 26, pp. 113-121.

Tevis et al. "Synthesis of Liquid Core-Shell Particles and Solid Patchy Multicomponent Particles by Shearing Liquids into Complex Particles (SLICE)". Langmuir 2014, 30 (47), pp. 14308-14313.

Thompson et al. "A Stepped-Bar Apparatus for Thermal Resistance Measurements" J. Electron. Packag. 2013. 135 (4) . 41002, pp. 1-9.

Wang et al. "Highly Thermal Conductive Copper Nanowire Composites with Ultralow Loading: Toward Applications as Thermal Interface Materials". ACS Appl. Mater. Interfaces 2014, 6 (9), pp. 6481-6486.

Xie et al. "Dispersion and Alignment of Carbon Nanotubes in Polymer Matrix: A Review". Mater. Sci. Eng. R Reports 2005, 49 (4), pp. 89-112.

Yim et al. "Review of Recent Advances in Electrically Conductive Adhesive Materials and Technologies in Electronic Packaging". J. Adhes. Sci. Technol. 2008, 22 (14), pp. 1593-1630.

Zhu et al. "Highly Thermally Conductive Papers with Percolative Layered Boron Nitride Nanosheets". ACS Nano 2014, 8 (4), pp. 3606-3613.

\* cited by examiner

MULTI-LAYER THIN FILM COMPOSITE THERMAL INTERFACE MATERIALS

CROSS-REFERENCE TO RELATED APPLICATION

This application claims the benefit of U.S. Application No. 62/597,873 entitled "MULTI-LAYER THIN FILM COMPOSITE THERMAL INTERFACE MATERIALS" filed Dec. 12, 2017, which is incorporated by reference herein in its entirety.

TECHNICAL FIELD

This invention relates to a multi-layer thin film thermal interface material (TIM) with improved thermal conductivity.

BACKGROUND

Thermal management of integrated circuits (ICs) has become a limiting factor for transistor frequency, which has stalled around a few gigahertz over the past decade. The large thermal loads stem from extremely densely packed, nanometer-sized features of modern ICs, which provide minimal surface area for dissipation of the generated heat.

Thermal interface materials (TIMs) dissipate heat away from ICs by reducing the thermal contact resistance between electronic packaging components, such as processors and heat sinks, which stems from air gaps formed within geometrical imperfections of the two mating surfaces. TIMs eliminate air gaps by filling in the geometrical imperfections with materials that have a high thermal conductivity (k). Some commercially available TIMs consist of thin metal foils of moderately low melting temperature ($T_{melt}$) such as In (with $T_{melt}$=157° C. and thermal conductivity k≈80 $Wm^{-1}K^{-1}$) or alloys such as Sn—Bi (with $T_{melt}$=138° C. and k≈20 $Wm^{-1}K^{-1}$). However, even these relatively low melting temperatures have low mechanical compliance, leading to thermal fatigue in the IC due at least in part to the large mismatch in coefficients of thermal expansion between the IC components, making the IC packaging process more complex and costly.

TIMs consisting of gallium based liquid metals (LMs) are available commercially. However, the gallium is known to induce degradation of metals, such as aluminum, used in IC packaging. The liquid nature of the metal can also pose another mode of long-term operational failure referred to as "pump-out," or "squeezing out" of some of the TIM and formation of hot-spots in the vacated voids.

Most commercial TIMs rely on low-cost ceramic or metal additives, such as $Al_2O_3$, graphite, and Ag flakes. However, the effective thermal conductivity, $k_{eff}$, of the composite is typically limited by the interfacial resistance between the particles and the matrix and, when the percolation threshold is crossed, between the particles themselves.

SUMMARY

In a first general aspect, a layered composite configured to form an interface between a heat exchanger and an integrated circuit includes a first polymer layer, a second polymer layer, a liquid metal in direct contact with the first polymer layer, a solid solute in direct contact with the second polymer layer, and a barrier between the liquid metal and the solid solute. The liquid metal is liquid at normal temperature and pressure. The solid solute includes microparticles, nanoparticles, or both, and is solid at normal temperature and pressure. The barrier prevents contact of the liquid metal and the solid solute at normal temperature and pressure, and is configured to rupture under compression of the layered composite, thereby allowing the liquid metal and the solid solute to form a mixture between the first polymer layer and the second polymer layer.

Implementations of the first general aspect may include one or more of the following features.

The mixture may include an alloy or a colloid. The liquid metal includes at least one of Ga, GaIn, GaInSn, BiSn, BiIn, and BiInSn. The liquid metal may be in the form of droplets or in the form of a thin film. The solid solute is selected to react with the liquid metal. The solid solute may include one or more of nickel, copper, silver, and gold. The solid solute typically does not react with the liquid metal at room temperature. The solid solute may include one or more of tungsten, single grain aluminum, alumina, silica, silicon, silicon carbide, boron nitride, and an allotrope of carbon. The allotrope of carbon may include one or more of graphite, graphene, carbon nanotubes, and diamond. In some cases, the first polymer layer, the second polymer layer, or both includes polydimethylsiloxane. In certain cases, the first polymer layer, the second polymer layer, or both includes a thermally conductive additive in a liquid state or a solid state. The barrier may include a metal oxide, a polymer, or an allotrope of carbon. The liquid metal may be in the form of a thin film, and the barrier forms a layer between the liquid metal and the solid solute. The liquid metal may be in the form of droplets, and the barrier forms a coating on the droplets.

In a second general aspect, a device includes a heat exchanger, an integrated circuit, and the layered composite of the first general aspect between the heat exchanger and the integrated circuit.

Implementations of the second general aspect may include one or more of the following features.

Compression of the layered composite between the heat exchanger and the integrated circuit may be configured to rupture the barrier, such that the liquid metal and the solid solute react to form an alloy. Compression of the layered composite between the heat exchanger and the integrated circuit may be configured to rupture the barrier, thereby forming a colloid comprising the liquid metal and the solid solute.

In a third general aspect, thermally coupling a heat exchanger and an integrated circuit includes positioning the layered composite of the first general aspect between a heat exchanger and an integrated circuit to form a multilayer device, compressing the multilayer device to rupture the barrier between the liquid metal and the solid solute, and forming a mixture of the liquid metal and the solid solute in situ between the heat exchanger and the integrated circuit.

Implementations of the third general aspect may include filling the area between heat exchanger and the substrate with the mixture.

Figure 4:
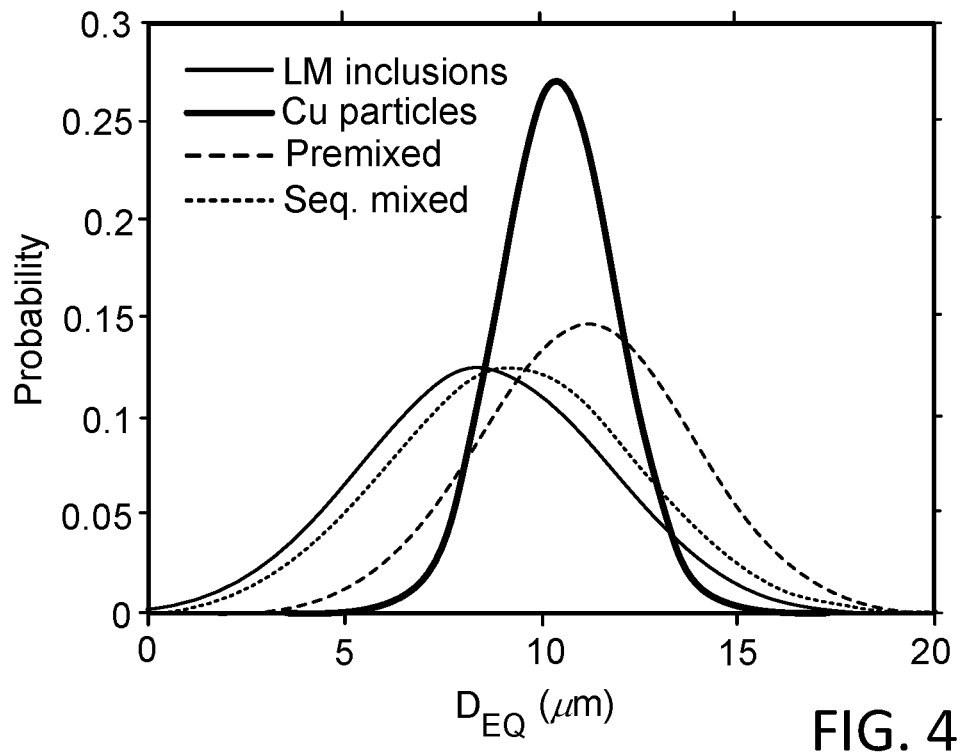

FIG. 4 shows a plot of the particle size distributions where DEQ is the equivalent diameter based on the particle and inclusion areas from image particle analysis.

Figure 5:
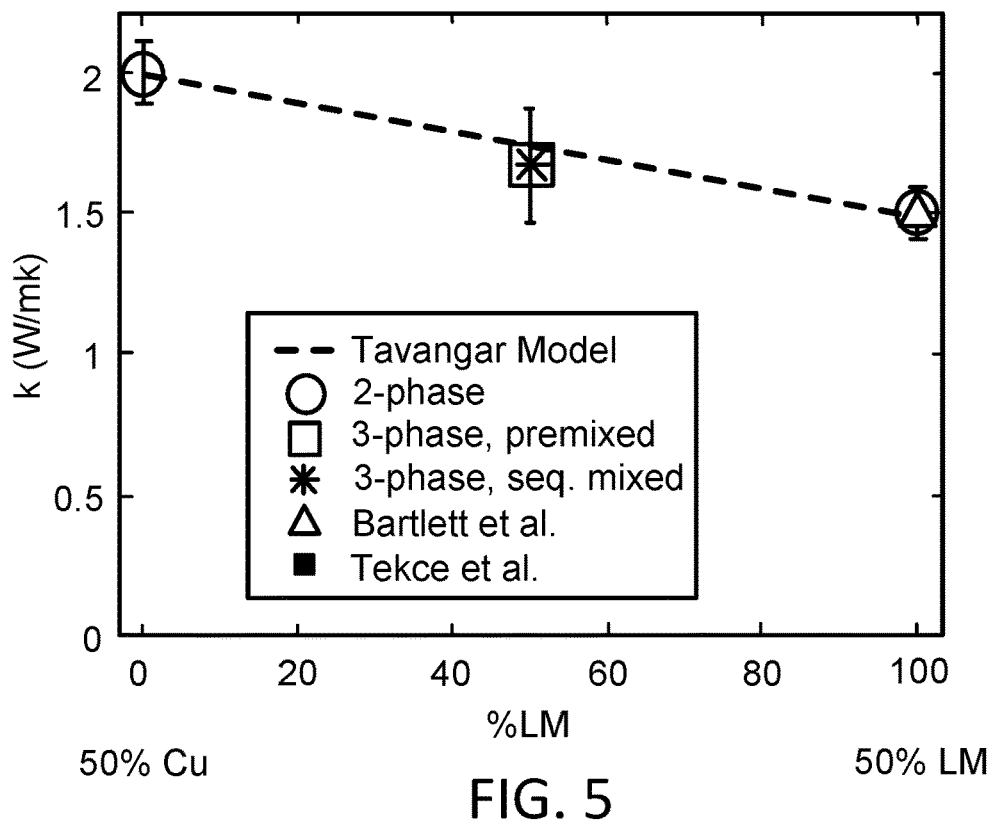

FIG. 5 shows a plot of the measured and theoretically predicted two-component and three-component composite thermal conductivities.

Figure 6:
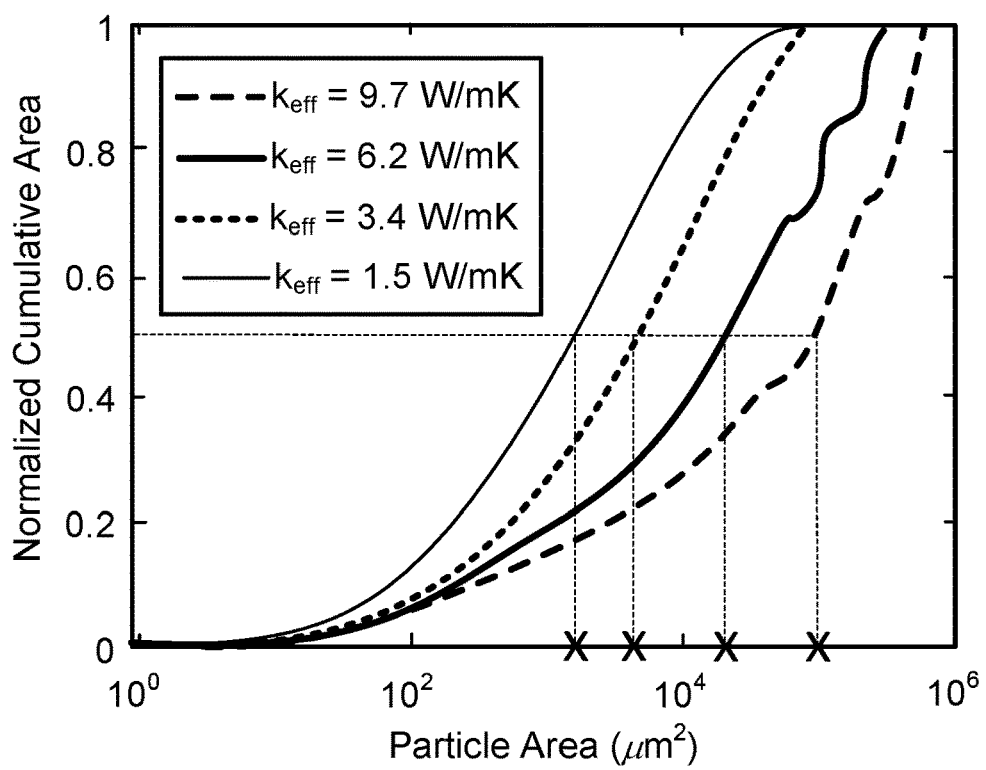

FIG. 6 shows normalized cumulative area distributions for pre-mixed Cu-LM polydimethylsiloxane (PDMS) composites with indication of the 50th percentile particle area distribution (PAD50%) utilized to characterize each distribution.

DETAILED DESCRIPTION

A non-corrosive thermal interface material (TIM) including liquid metal, solid particles, and a polymer matrix, is described. This TIM includes soft, exterior polymer composites encapsulating a mixture including a metal that is liquid at normal temperature and pressure (the "liquid metal") and solute that is solid at normal temperature and pressure (the "solid solute"). As used herein, "normal temperature and pressure" refers to a temperature of 20° C. and a pressure of 1 atm. Examples of suitable liquid metals include Ga, GaIn, GaInSn, BiSn, BiIn, and BiInSn. The liquid metal may be in the form of droplets or a thin film. Examples of suitable solid solutes include metals such as Cu, Ni, Ag, Au, other metals that alloy with the liquid metal (reactive solutes), and metals such as W or single grain Al that do not react with the liquid metal near room temperature (non-reactive solutes). Other examples of suitable non-reactive solid solutes include thermally conductive non-metallic particles such alumina, silica, Si, SiC, BN, and C (graphite, graphene, nanotubes, diamond). The solid solute may be in the form of particles, such as microparticles or nanoparticles. The liquid metal and the solid solute are separated by a barrier layer, which may be in the form of a film between the liquid metal thin film and the solid solute or a coating on the liquid metal droplets or on the solid solute. An example of a barrier layer is the native oxide that forms on gallium-based alloys or its permutation stemming from chemical modification.

Figure 1:
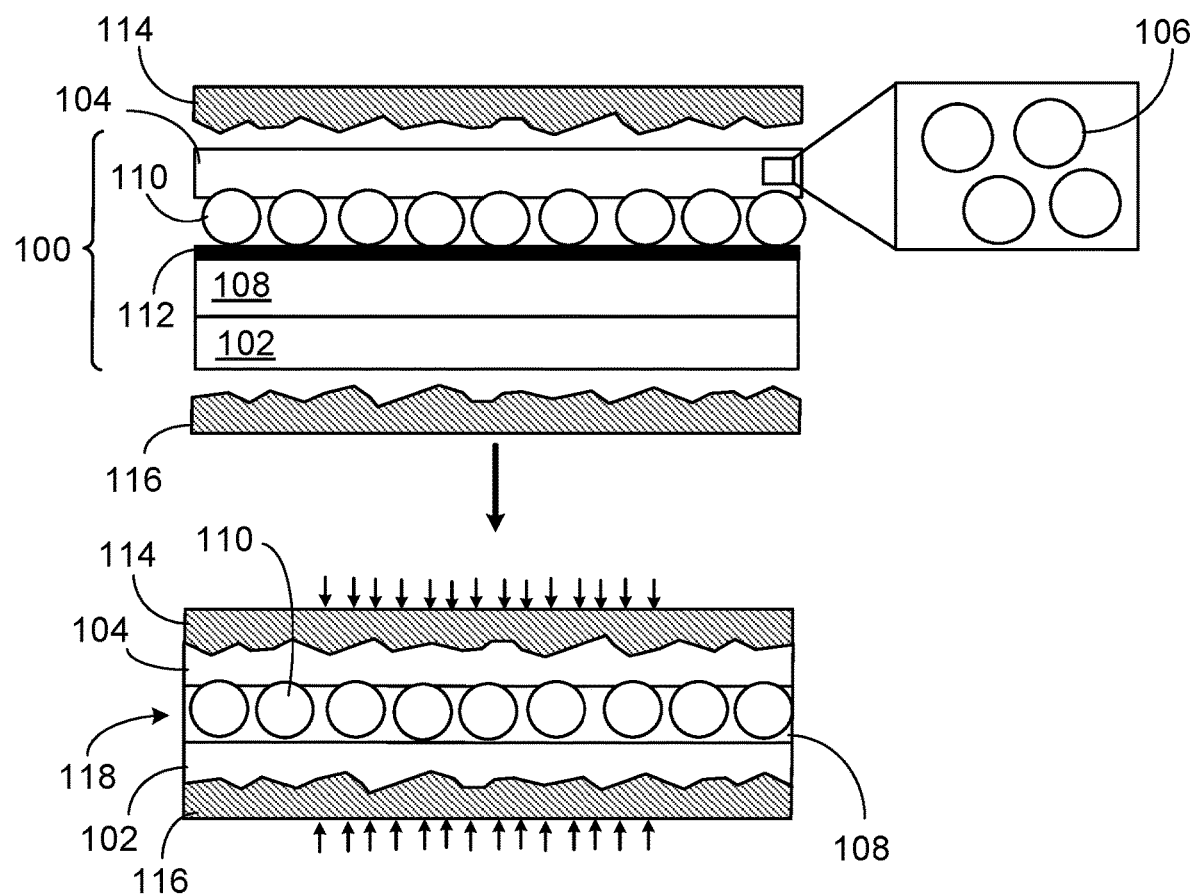
FIG. 1 depicts a first example of a thermal interface material in the form of a layered composite.
Figure 2:
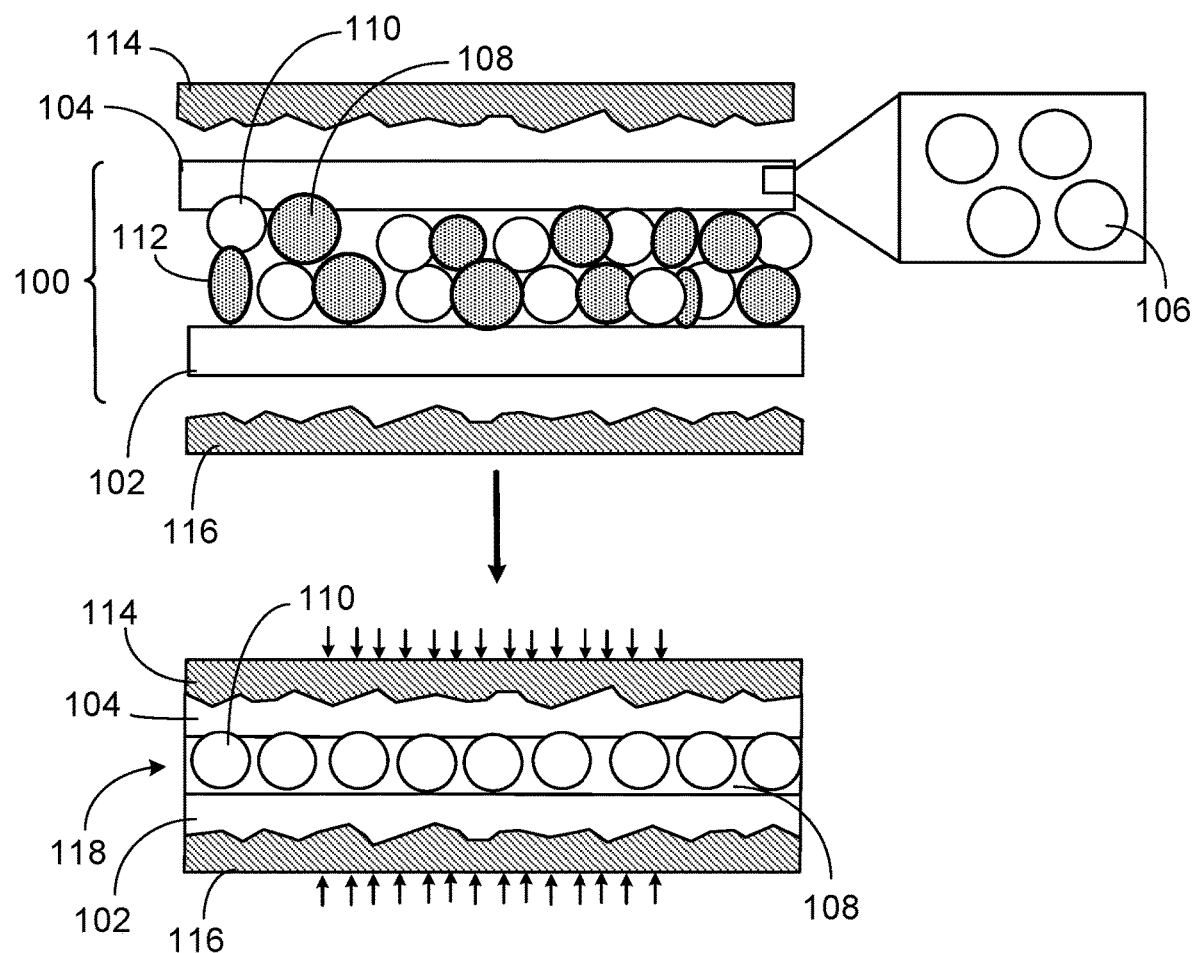
FIG. 2 depicts a second example of a thermal interface material in the forms of a layered composite.

FIG. 1 depicts layered composite or TIM 100. A thickness of TIM 100 is typically in a range of 5 µm to 250 µm. Layered composite 100 includes first polymer layer 102 and second polymer layer 104. A thickness each of first polymer layer 102 and second polymer layer 104 is typically in a range of 2 µm to 150 µm. In one example, first and second polymer layers 102, 104 include polydmethylsiloxane (PDMS). As shown in the inset, first polymer layer 102, second polymer layer 104, or both may include additive 106. Suitable additives include solid and liquid thermally conductive substances. Liquid metal 108 is in direct contact with first polymer layer 102. Solid solute 110 is in direct contact with second polymer layer 104. Barrier 112 prevents or inhibits contact of liquid metal 108 and solid solute 110 at normal temperature and pressure. A dimension of solid solute 110 is typically in a range of 0.5 µm to 20 µm. Suitable examples of barrier 112 include native oxide layers on liquid metal 108 or an additional thin barrier, such as carbon, polymer, or non-native oxide between liquid metal 108 and solid solute 110. Barrier 112 can be in in the form of a planar or film barrier. In some cases, as depicted in FIG. 2, barrier 112 is in the form of a shell or coating separating nano- or microscale liquid metal (LM) droplets from the solid solute. A thickness of barrier 112 is typically in a range of 0.5 nm to 20 µm.

When layered composite or TIM 100 is placed between heat exchanger 114 and substrate 116, liquid metal 108 and solid solute 110 are combined (come in direct contact) through compression of the TIM, which ruptures barrier 112, thereby forming mixture 118 of liquid metal 108 and solid solute 110. As used herein, heat exchanger 114 includes heat sinks and heat spreaders. In one example, substrate 116 is an integrated circuit. Since Ga-based alloys are reactive with most metals (with exception of W), solid solute 110 can be selected to improve the thermal properties of mixture 118, as well as immobilize it through alloying. For example, use of Cu particles results in the formation of $CuGa_2$, which has significantly improved thermal conductivity over Ga alone or its alloys. Furthermore, the ratio of Ga-based alloy and the solid solute can be adjusted to alter the consistency of mixture 118 (i.e., some of the liquid metal is left unalloyed). This results in creation of a TIM that handles cyclic thermal warping of the device better than solid or grease equivalents. Leakage of Ga is also minimized by in-situ alloying mechanisms, which immobilize most of the Ga. Solid solutes that are non-reactive, such as W, can be used if higher compliance of the overall TIM is preferred. The mechanical properties of the TIM can also be adjusted by changing the relative amount of liquid metal 108 and solid solute 110, thereby achieving different levels of new phase formation when the solid solute reacts with the liquid metal or adjusting viscosity of a colloid that results when the solid solute does not react with the liquid metal. A ratio of liquid metal 108 to solid solute 110 can range from up to 100% liquid metal to less than 1% solid solute and from up to 100% solid solute to less than 1% liquid metal. In some cases a ratio of liquid metal 108 to solid solute 110 ranges from 90 vol %:10 vol % liquid metal to solid solute to 30 vol %:70 vol % liquid metal to solid solute.

FIG. 1 illustrates the layout and process for creating TIMs with an all thin film form, and FIG. 2 illustrates the layout and process for creating TIMs with an intermixed particulate interlayer form. As shown in FIGS. 1 and 2, to create the TIM, liquid metal 108 and solid solute 110 are placed between first polymer layer 102 and second polymer layer 104. In the thin film form, as shown in FIG. 1, barrier 112, such as a native liquid metal oxide, separates liquid metal 108 and solid solute 110 in the form of a thin film. In samples in which liquid metal 108 and solid solute 110 are intermixed between first polymer layer 102 and second polymer layer 104, as shown in FIG. 2, liquid metal 108 and solid solute 110 in the form of droplets are segregated by barrier 112 on the liquid metal, such as an oxide in the form of a coating. First polymer layer 102 and second polymer layer 104 may be solid or liquid, and may include additives 106, such as thermally conductive additives. The entire multilayer TIM 100 is typically placed between heat exchanger 114 and substrate 116. TIM 100 is then subjected to compression. This compressive force ruptures barrier 112 between liquid metal 108 and solid solute 110. The rupture of barrier 112 results in formation of a slurry or mixture 118 of liquid metal 108 and solid solute 110, and the mixture conforms to the surfaces between which it contained. When the solid solute reacts with the liquid metal, mixture 118 alloys in situ.

First and second polymer layers 102, 104 of TIM 100 also serve to reduce or prevent initial or long term Ga leaks and corrosion. These layers are sufficiently soft to conform to heat sink and IC surface imperfections and provide convenient packaging for handling and application.

Barrier 112 simplifies handling and application of TIMS by eliminating the need to mix powdered ingredients, which often requires special equipment, in order to deploy the TIM. As with two component paints or epoxies, having a two-component liquid metal TIM that needs to be mixed with Cu powder is inconvenient and is likely to result in irreproducible properties, since there is a limited period of time before the mixed slush solidifies (i.e., if applied too late, it would result in a poor thermal contact since it would not conform to the mating surface's roughness).

The architecture of the disclosed TIM can be fabricated on a large scale using standard mixing, spin-coating, dip-coating, doctor-blading, or spraying processes. The TIM composite can be placed in between two low surface energy polymers that may include release agents, and the produced large sheet can be cut into integrated circuit-sized pieces (e.g., 1 cm by 1 cm) or cut in long strips that can be rolled out.

EXAMPLES

Composite Fabrication

Composites were fabricated by manually mixing together the GaInSn LM (Rotometals), Cu microparticles (10 μm APS, Alfa Aesar), and the polydimethylsiloxane matrix (PDMS, Sylgard® 184 with 10:1 base to curing agent ratio by weight) with mortar and pestle. The mixture was then poured in an open silicon mold and cured in an oven. Particle dispersion was controlled using the mixture time. All composites were made at a filler volume fraction of ϕ=0.5. The casting mold consists of top and bottom silicon wafers with glass slide spacers that determine the sample thickness. In order to maintain contact between the silicon wafers and the glass spacers, thereby ensuring constant thickness throughout the sample, two 200 g weights were placed on top of the mold assembly for the duration of the cure. All samples were ~2 mm thick prior to compression during the thermal transport measurement. All samples were cured in an oven (Fisher Scientific Isotemp 280A) at 100° C. for two hours.

Figure 3:
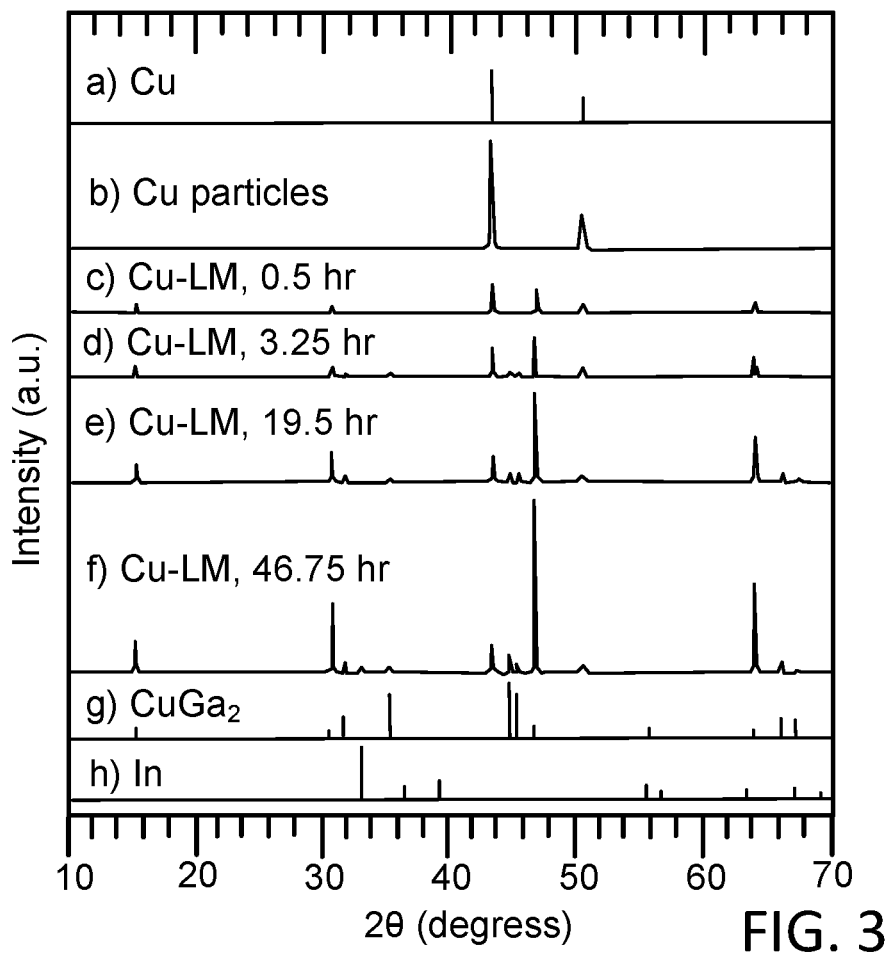
FIG. 3 shows X-ray diffraction patterns of (a) Cu powder; (b) Cu microparticles; liquid metal (LM)-Cu mixtures (1:1 ratio) at (c) 0.5 hours, (d) 3.25 hours, (e) 19.5 hours, and (f) 46.75 hours after mixing; (g) $CuGa_2$ powder diffraction; and (h) In powder diffraction.

Two approaches were used to combine the LM and Cu additives with the PDMS matrix. In one approach, the additives were mixed into the PDMS sequentially (LM followed by Cu). In the other approach, the LM and Cu were pre-mixed together prior to dispersing them in the PDMS. The sequential additive mixing method results in predominantly isolated micro-fillers with minimal LM-Cu interactions. Conversely, the additive premixing method ensures maximal interaction between the LM and Cu. This method produces initially heterogeneous LM-Cu particles that spontaneously alloy into $CuGa_2$ over time and in situ. In addition, the liquid state of the Ga in the LM kinetically facilitates $CuGa_2$ formation. $CuGa_2$ formation via x-ray diffraction (XRD) was observed, as shown in FIG. 3. As can be seen in FIG. 3, $CuGa_2$ diffraction peaks in as little as 30 minutes after mixing the Cu and LM together were observed. Continual formation of $CuGa_2$ is also observed as the intensity ratio of the $CuGa_2$ peaks relative to the Cu peaks increases over time, as demonstrated FIG. 3. Extraction of Ga from the LM can also be indirectly observed through the appearance of an In diffraction peak at 33.0° at 46.75 hours, as shown in FIG. 3. This diffraction peak indicates the formation of crystalline In, which results due to LM solidification (i.e., extracting Ga from the LM changes the LM elemental composition and increases the melting temperature to above room temperature).

Composite Characterization

The morphology of the composites was imaged using high magnification optical microscopy. Zeiss Axio Zoom.V16 with an objective lens of 2.3×/0.57 FWD and 10.6 mm focal length (Zeiss PlanNeoFluar Z) as well as scanning electron microscopy (SEM) (Amray 1910 with field emission gun) were used.

Two image processing methods were used to quantify the extent of filler dispersion in the samples. For the samples with micro-dispersed spheroid-like fillers an equivalent diameter $D_{EQ}$, was calculated to evaluate particle size such that:

$$D_{EQ} = \sqrt{\frac{4A_p}{\pi}}$$

where $A_p$ is the area of the particles as identified with ImageJ. For the samples with strongly poly-dispersed LM-Cu fillers, however, determination of an equivalent diameter was not representative due to highly random nature of the filler shapes. Consequently, for these samples the particle area distribution (PAD) was reported. Furthermore, because the PAD is highly non-Gaussian (large number of particles with small area and a few particles with very large areas), the PAD is presented in cumulative terms. Specifically, the cumulative particle area distribution corresponds to summation of the particle areas, sorted from the smallest to the largest, up to a given area value. The distribution is normalized by the total cumulative area. As a representative measure of the cumulative particle area, the 50 percentile (referred to as $PAD_{50\%}$) was used. For each sample, 8 to 10 images of the surface at various locations were analyzed. Filler was separated from matrix through manual thresholding.

The thermal resistances of the samples was measured using a stepped-bar apparatus (SBA), which is based on the ASTM D5470 standard for measuring the thermal resistance of thin materials. The SBA in this experiment includes a linear encoder and a load cell that measure sample thickness and pressure during the thermal resistance measurements. Measuring thermal conductivity fundamentally requires applying a known heat flux to a sample of known geometry and then measuring the temperature drop across the sample. In this method, a steady state temperature gradient across the sample was created using a heat source and a heat sink. The sample was placed between two metallic reference bars of known cross-sectional area and thermal conductivity. The top bar had a larger cross-section than the bottom bar to minimize errors from misalignment. The temperature distribution in the reference bars (measured via thermocouples in precision-machined holes along the reference bar lengths) was then used to measure the heat flux, q, in the bars. Because the system is well insulated, the measured heat flow through the bars is equal to the measured heat flow through the sample. Extrapolating the temperature distributions of the reference bars to the bar-sample interfaces allows the temperature drop across the sample, ΔT, to be determined. The measured thermal resistance, $R_{th}$, across the sample was then found with $$R_{th} = \sqrt{\frac{\Delta T}{q}}$$

This thermal resistance represents the summation of the sample's intrinsic thermal resistance, $R_s$, as well as the thermal contact resistance, $R_c$, between the sample and the reference bars. $R_c$ is the sum of two contact resistances, the contact resistance between the top reference bar and the top of the sample and the contact resistance between the bottom reference bar and the bottom of the sample. The samples were maintained under pressure to bring $k_{eff}$ closer to the true k of the composite. Various loads were used to gauge sample properties.

The measured thermal resistances, $R_{th}$, can be converted into intrinsic thermal conductivity values using the sample thickness, $t_c$, and the sample contact resistance, $R_c$. Thickness of the samples was obtained using the linear encoder integrated into the stepped-bar apparatus thermal transport measurement system. $R_c$ was estimated by measuring the thermal resistance of several samples with varying thickness and extrapolating to zero thickness. The value for was estimated to be $1.2 \times 10^{-4}$ m$^2$KW$^{-1}$ and $8 \times 10^{-5}$ m$^2$KW$^{-1}$ at 1.5 MPa for well-dispersed samples and less-dispersed samples, respectively. The single-side contact resistance, $R_c/2$, ($4 \times 10^{-5}$ m$^2$KW$^{-1}$) is comparable to Si—Al interfaces at the same pressure ($2 \times 10^{-5}$ m$^2$KW$^{-1}$). With $R_{th}$ and $t_c$ known, the effective thermal conductivity was calculated using the following equation:

$$k_{eff} = \frac{t_c}{R_{th}} = \frac{t_c}{R_c + R_s}$$

This effective thermal conductivity includes the combined effects of the intrinsic sample resistance and the sample contact resistance. Consequently, the effective thermal conductivity is smaller than the intrinsic sample thermal conductivity. To account for the heterogeneity of the samples with large inclusions of several hundred microns in size, the samples are described with an effective intrinsic thermal conductivity, $\bar{k}$, of the composite which can be calculated via the following equation:

$$\bar{k} = \frac{t_c}{R_{th} - R_c}.$$

Due to the Mullins effect of PDMS, which results in a change or relaxation of the modulus between the first loading and the second, each sample was measured only once and only with increasing pressure. The overall measurement uncertainty was estimated in $k_{eff}$ ranges from 4-6% (68% confidence). Additional uncertainty arises as the thermal conductivities of the sample and reference bars become more similar, and this corresponds to the higher end of the previously mentioned uncertainty range. Thermal conductivity measurements were validated against literature results on PDMS-liquid metal composite. The measured PDMS thermal conductivity of 0.27±0.01 Wm$^{-1}$K$^{-1}$ closely matched the thermal conductivity as stated by the manufacturer (Sylgard 184), 0.27 Wm$^{-1}$K$^{-1}$.

Results

The thermal properties of three-component composites with inclusion size distribution comparable to two-component Cu-only and LM-only composites were evaluated. The manual blending process can produce uniformly microdispersed Cu only, LM-only, sequentially-mixed LM-Cu and pre-mixed LM-Cu filler in the PDMS matrix. The particle size probability distribution plots shown in FIG. 4 demonstrate that the manual blending process can produce LM micro-droplets ($D_{EQ}$=8.6±3.2 µm, 68% confidence) and LM-Cu particles ($D_{EQ}$=11.2±2.8 µm for premixed and 9.3±3.2 µm for sequentially mixed) close to that of the Cu particles ($D_{EQ}$=10.5±1.5 µm). These probability distributions are fit from particle size distributions of the well-dispersed samples, assuming normal distributions. Because the particle distributions are similar in average size, the difference in the thermal conductivity of the composites should be predominantly determined by the thermal properties of the constituents and their volume fractions, $\phi$.

To predict thermal conductivity, a shape factor L was added to the model as described by Tavangar to adjust for ellipsoidal LM inclusions when under load. The Tavangar model is a differential effective medium (DEM) scheme that accounts for interface thermal resistance between particles and the matrix and is fairly accurate at high volume fraction filler. The Tavangar model is given as:

$$1 - \phi = \frac{(k_m)^L (k_p k_c R_b + ak_c - ak_p)}{(k_c)^L (k_p k_m R_b + ak_m - ak_p)}$$

where L is the shape factor and is equal to ⅓ when the filler particles are spherical, $k_p$ is the thermal conductivity of the particles or inclusions, $k_m$ is the thermal conductivity of the matrix, $k_c$ is the thermal conductivity of the composite, $R_b$ is the interface thermal resistance, a is the radius of the particles. Since the Tavangar model only considers composites with two components, the Tavangar model was sequentially applied for the composites with three components. The Tavangar model was first used to calculate the thermal conductivity of a composite consisting of LM particles in a PDMS matrix, $k_{LM-PDMS}$. Next, a composite consisting of Cu particles in a matrix was considered and $k_{LM-PDMS}$ was used as the matrix thermal conductivity, $k_m$, to yield the overall thermal conductivity of a Cu-LM-PDMS composite.

FIG. 5 shows measured and theoretically predicted values of $k_c$ for the two-component and three-component composites as the ratio of LM to Cu is varied and $\phi$ is held constant at 0.5 (i.e. 50% PDMS and the other 50% a ratio of LM and Cu). In the legend, "Bartlett et al." refers to Bartlett, M. D.; Kazem, N.; Powell-Palm, M. J.; Huang, X.; Sun, W.; Malen, J. A.; Majidi, C. High Thermal Conductivity in Soft Elastomers with Elongated Liquid Metal Inclusions. *Proc. Natl. Acad. Sci.* 2017, 114 (9), 2143-2148, and "Tekce et al." refers to Tekce, H. S.; Kumlutas, D.; Tavman, I. H. Effect of Particle Shape on Thermal Conductivity of Copper Reinforced Polymer Composites. J. Reinf. Plast. Compos. 2007, 26, 113-121. As shown in FIG. 5, the three-component composites have thermal conductivities in between the 2.0±0.1 Wm$^{-1}$K$^{-1}$ for Cu-only PDMS composite and the 1.5±0.1 Wm$^{-1}$K$^{-1}$ for LM-only PDMS composite. Specifically, the sequentially mixed and pre-mixed LM-Cu PDMS composites both had thermal conductivities of 1.65±0.15 Wm$^{-1}$K$^{-1}$. All of the measured composite thermal conductivities with well dispersed filler were about an order of magnitude higher than the matrix material (0.27±0.01 Wm$^{-1}$K$^{-1}$) and are comparable to previously described composites. These results demonstrate that increasing the thermal conductivity of the filler particles has diminishing returns. In particular, a 14-fold change in thermal conductivity of the filler from 28 Wm$^{-1}$K$^{-1}$ for LM to 400 Wm$^{-1}$K$^{-1}$ for Cu results in only about a 1.3-fold increase in the thermal conductivity of the composite. Thus, a more substantial thermal conductivity enhancement may be achieved by decreasing the thermal boundary resistance between the particles and matrix and/or decreasing the particle-particle interface resistance.

Pre-mixing the Cu-particles into bulk LM provides a unique opportunity to enhance the composite thermal conductivity by decreasing the number of filler-PDMS boundaries by varying the levels of the LM-Cu colloid dispersion. By adjusting the manual blending time of the LM-Cu colloid into PDMS, dramatically different morphologies of the inclusions can be achieved. In particular, decreasing the mixing time from 300 seconds (used for the micro-dispersed composites) to ~20-30 seconds results in a broad particle distribution with feature sizes ranging from a few microns to hundreds of microns. The filler dispersion was quantified using image processing to evaluate the particle cluster area distributions. FIG. 6 shows the normalized cumulative cluster area distributions corresponding to example sample images. The effective thermal conductivities of pre-mixed LM-Cu PDMS composites were compared against their 50th percentile normalized cumulative cluster area distribution achieved through varied mixing time. These results demonstrate that retaining large fill structures within the matrix enhances thermal performance up to an effective thermal conductivity of $10\pm0.6$ $Wm^{-1}K^{-1}$ (or an effective intrinsic thermal conductivity of $\bar{k}\approx17\pm3$ $Wm^{-1}K^{-1}$ is accounted for).

All the thermal conductivity data falls between the lower bound of uniformly micro-dispersed particles ($k_{eff}\approx2$ $Wm^{-1}K^{-1}$) and the upper bound of a two part composite with 50% PDMS and 50% $CuGa_2$ (k=98 $Wm^{-1}K^{-1}$) blocks arranged in parallel ($k_{eff}\approx16$ $Wm^{-1}K^{-1}$). The process in which the LM matrix composites were made enables casting these composites into any shape and size prior to the solidification/formation of $CuGa_2$. The limited shape and size of composites using large Cu particles in PDMS makes them impractical for use as TIMs.

Another benefit of the in situ $CuGa_2$ formation is that it immobilizes the Ga, preventing any liquid leakage and associated corrosion of surrounding metals. This characteristic makes the disclosed composites safe to use with aluminum heat sinks and other metal components. For a pre-mixed composite sample pad after 40 hours of being positioned between aluminum foil at 55° C. and 3 MPa next to aluminum foil that was exposed to a drop of LM at room temperature for 24 hours with no applied pressure, it was shown that no macroscopic corrosion of the aluminum foil occurred with the pre-mixed composite samples. Furthermore, to demonstrate that the samples can be applied with LM-Cu in the colloidal state, a three-component sample was cured in between two pieces of aluminum foil for 2 hours at 100° C. As in the previous case, no evidence of corrosion of the aluminum foil was observed. These results indicate that the affinity of Ga to Cu is sufficient to prevent the Ga from leaching from the polymer and reacting with Al, and, therefore, the three-component composites is safe to cure in place next to aluminum components.

A number of embodiments have been described. Nevertheless, it will be understood that various modifications may be made without departing from the spirit and scope of the disclosure. Accordingly, other embodiments are within the scope of the following claims.

What is claimed is:

1. A layered composite comprising:
   a first polymer layer;
   a second polymer layer;
   a liquid metal in direct contact with the first polymer layer, wherein the liquid metal is liquid at normal temperature and pressure;
   a solid solute in direct contact with the second polymer layer, wherein the solid solute comprises microparticles, nanoparticles, or both and is solid at normal temperature and pressure; and
   a barrier between the liquid metal and the solid solute, wherein the barrier prevents contact of the liquid metal and the solid solute at normal temperature and pressure, and is configured to rupture under compression of the layered composite, thereby allowing the liquid metal and the solid solute to form a mixture between the first polymer layer and the second polymer layer,
   wherein the layered composite is configured to form an interface between a heat exchanger and an integrated circuit.

2. The layered composite of claim 1, wherein the mixture comprises an alloy or a colloid.

3. The layered composite of claim 1, wherein the liquid metal comprises at least one of Ga, GaIn, GaInSn, BiSn, BiIn, and BiInSn.

4. The layered composite of claim 3, wherein the liquid metal is in the form of droplets.

5. The layered composite of claim 3, wherein the liquid metal is in the form of a thin film.

6. The layered composite of claim 1, wherein the solid solute is selected to react with the liquid metal.

7. The layered composite of claim 6, wherein the solid solute comprises one or more of nickel, copper, silver, and gold.

8. The layered composite of claim 1, wherein the solid solute does not react with the liquid metal at room temperature.

9. The layered composite of claim 8, wherein the solid solute comprises one or more of tungsten, single grain aluminum, alumina, silica, silicon, silicon carbide, boron nitride, and an allotrope of carbon.

10. The layered composite of claim 9, wherein the allotrope of carbon comprises one or more of graphite, graphene, carbon nanotubes, and diamond.

11. The layered composite of claim 1, wherein the first polymer layer, the second polymer layer, or both comprises polydimethylsiloxane.

12. The layered composite of claim 1, wherein the first polymer layer, the second polymer layer, or both comprises a thermally conductive additive in a liquid state or a solid state.

13. The layered composite of claim 1, wherein the barrier comprises a metal oxide, a polymer, or an allotrope of carbon.

14. The layered composite of claim 1, wherein the liquid metal is in the form of a thin film, and the barrier forms a layer between the liquid metal and the solid solute.

15. The layered composite of claim 14, wherein the liquid metal is in the form of droplets, and the barrier forms a coating on the droplets.

16. A device comprising:
   a heat exchanger;
   an integrated circuit; and
   the layered composite of claim 1 between the heat exchanger and the integrated circuit.

17. The device of claim 16, wherein compression of the layered composite between the heat exchanger and the integrated circuit is configured to rupture the barrier, such that the liquid metal and the solid solute react to form an alloy.

18. The device of claim 16, wherein compression of the layered composite between the heat exchanger and the integrated circuit is configured to rupture the barrier, thereby forming a colloid comprising the liquid metal and the solid solute.

19. A method of thermally coupling a heat exchanger and an integrated circuit, the method comprising:
   positioning the layered composite of claim 1 between a heat exchanger and an integrated circuit to form a multilayer device;
   compressing the multilayer device to rupture the barrier between the liquid metal and the solid solute; and
   forming a mixture of the liquid metal and the solid solute in situ between the heat exchanger and the integrated circuit.

20. The method of claim 19, further comprising filling an area between the heat exchanger and the integrated circuit with the mixture.

* * * * *